US010176968B2

(12) United States Patent
Shigeto et al.

(10) Patent No.: US 10,176,968 B2
(45) Date of Patent: Jan. 8, 2019

(54) METHOD FOR ADJUSTING CHARGED PARTICLE BEAM DEVICE AND ADJUSTING BEAM APERTURE BASED ON A SELECTED EMISSION CONDITION AND CHARGED PARTICLE BEAM DEVICE FOR SAME

(71) Applicant: Hitachi High-Technologies Corporation, Minato-ku, Tokyo (JP)

(72) Inventors: Kunji Shigeto, Tokyo (JP); Mitsugu Sato, Tokyo (JP); Tsutomu Saito, Tokyo (JP); Kohtaro Hosoya, Tokyo (JP); Yoshihiro Takahoko, Tokyo (JP); Tohru Ando, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 58 days.

(21) Appl. No.: 14/896,753

(22) PCT Filed: Apr. 4, 2014

(86) PCT No.: PCT/JP2014/060037
§ 371 (c)(1),
(2) Date: Dec. 8, 2015

(87) PCT Pub. No.: WO2014/199709
PCT Pub. Date: Dec. 18, 2014

(65) Prior Publication Data
US 2016/0118218 A1    Apr. 28, 2016

(30) Foreign Application Priority Data

Jun. 14, 2013 (JP) .................................. 2013-125591

(51) Int. Cl.
*H01J 37/26* (2006.01)
*H01J 37/20* (2006.01)
(Continued)

(52) U.S. Cl.
CPC ............ *H01J 37/265* (2013.01); *H01J 37/09* (2013.01); *H01J 37/20* (2013.01); *H01J 37/28* (2013.01)

(58) Field of Classification Search
None
See application file for complete search history.

(56) References Cited

U.S. PATENT DOCUMENTS 6,552,340 B1* 4/2003 Krivanek ............ H01J 37/153
                                                    250/305
2003/0201393 A1* 10/2003 Tsuneta .................. H01J 37/26
                                                    250/311
(Continued)

FOREIGN PATENT DOCUMENTS

JP          61-26249 U       2/1986
JP          2002-353128 A    12/2002
(Continued)

OTHER PUBLICATIONS

International Preliminary Report on Patentability (PCT/IB/338 & PCT/IB/373) issued in PCT Application No. PCT/JP2014/060037 dated Dec. 23, 2015, including English translation of document C2 (Japanese-language Written Opinion (PCT/ISA/237)) previously filed on Dec. 8, 2015 (six (6) pages).

(Continued)

*Primary Examiner* — Wyatt Stoffa
*Assistant Examiner* — James Choi
(74) *Attorney, Agent, or Firm* — Crowell & Moring LLP

(57) ABSTRACT

The present invention relates to enabling a versatile charged particle beam device, which is used for a wide range of kinds of samples to be observed and has parameters of emission conditions of a primary charged particle beam that is difficult to be registered in advance, to be operated easily and (Continued)

accurately even by a less-experienced operator and to obtain high-resolution images. A charged particle beam device according to the present invention includes, for example: a charged particle source, a focusing lens for a primary charged particle beam emitted from the charged particle source, an objective lens for focusing the primary charged particle beam, a movable objective aperture having multiple objective apertures disposed on a side of the charged particle source with respect to the objective lens, a detector of a secondary signal from the sample resulting from emission of the primary charged particle beam, a display unit configured to process and display a detected secondary signal, and a storage unit configured to store multiple emission conditions of the primary particle beam. The operation controller makes one emission condition be selected, determines whether or not the objective aperture is suitable for the selected emission condition, displays that the objective aperture is unsuitable when the objective aperture is unsuitable, and preadjusts the primary charged particle beam according to the selected emission condition and stores the preadjustment result as parameters for the emission conditions when the objective aperture is suitable.

13 Claims, 7 Drawing Sheets

(51) Int. Cl.
*H01J 37/09* (2006.01)
*H01J 37/28* (2006.01)

(56) References Cited

U.S. PATENT DOCUMENTS

| | | | |
|---|---|---|---|
| 2006/0226362 A1* | 10/2006 | Kitsuki | H01J 37/04 250/310 |
| 2007/0164219 A1* | 7/2007 | Shishido | H01J 37/263 250/310 |
| 2010/0227200 A1* | 9/2010 | Miyata | H01J 37/153 428/800 |

FOREIGN PATENT DOCUMENTS

| | | |
|---|---|---|
| JP | 2003-22771 A | 1/2003 |
| JP | 2005-108470 A | 4/2005 |
| JP | 2005-276639 A | 10/2005 |
| JP | 2008-84823 A | 4/2008 |
| JP | 2008-204675 A | 9/2008 |
| JP | 2008204675 A * | 9/2008 |

OTHER PUBLICATIONS

International Search Report (PCT/ISA/210) issued in PCT Application No. PCT/JP2014/060037 dated Apr. 28, 2014 with English translation (Four (4) pages).
Japanese-language Written Opinion (PCT/ISA/237) issued in PCT Application No. PCT/JP2014/060037 dated Apr. 28, 2014 (Three (3) pages).

* cited by examiner

METHOD FOR ADJUSTING CHARGED PARTICLE BEAM DEVICE AND ADJUSTING BEAM APERTURE BASED ON A SELECTED EMISSION CONDITION AND CHARGED PARTICLE BEAM DEVICE FOR SAME

TECHNICAL FIELD

The present invention relates to a charged particle beam device and a method for adjusting a charged particle beam device suitable for correcting an optical axis deviation of a charged particle optical system to stably obtain high-resolution images.

BACKGROUND ART

A charged particle beam device typified by a scanning electron microscope scans a desired area (field of view) of a sample with a charged particle beam, and records a charged particle signal generated from the scanning area in association with the scanning position to generate an image of the observed area. A scanning electron microscope has may parameters that can be freely set, such as accelerating voltage, probe current, the distance between an objective lens and a sample, and a signal detector, which are factors that give an impression of complicated operation.

Furthermore, various adjustment works such as optical axis alignment and astigmatism adjustment will be required each time the parameters are changed.

PTLS 1 and 2 are related art documents relating to the present invention. PTLS 1 and 2 both relate to automatic adjustment of a charged particle beam device.

PTL 1 relates to automatic adjustment of optical axis misalignment of an objective lens and automatic adjustment in which a movement of an image with respect to a change in an astigmatism corrector is canceled so that a field of view is corrected in such a manner that an observed image will not move during astigmatism adjustment. PTL 2 relates to automatic adjustment of an optical axis so that the optical axis will be aligned with the center of an objective aperture in addition to the disclosure of PTL 1.

CITATION LIST

Patent Literatures

PTL 1: Japanese Patent Application Laid-Open No. 2003-22771

PTL 2: Japanese Patent Application Laid-Open No. 2008-84823

SUMMARY OF INVENTION

Technical Problem

The inventors of the present application have conducted intensive study on correction of optical axis misalignment of a versatile charged particle beam device to be conducted by a less-experienced operator, and as a result, have achieved the following finding.

In an inspection device or measurement device for particular samples only, automatic adjustment with the technologies of PTLS 1 and 2 is very unlikely to be unsuccessful. In a versatile charged particle beam device capable of observing various types of observed samples and used for a wide range of kinds of samples, the adjustment conditions will be complicated and the automatic adjustment may thus be unsuccessful owing to the observed sample.

When automatic adjustment is unsuccessful, manual adjustment will be required. If manual adjustment is eventually required when automatic adjustment is unsuccessful, more operators would not use the automatic adjustment functions but make manual adjustment from the beginning.

Since, however, manual adjustment requires skills based on experience, the adjustment accuracy may vary depending on operators and it may take time to conduct the adjustment.

Some operators may continue observation without being aware of insufficient adjustment, and may be dissatisfied with the device performance. Furthermore, in recent years, since scanning electron microscopes are becoming no longer special devices that are used only by limited persons and the variety of operators is becoming wider, expectations for skill acquisition of the operators are expected to be difficult.

In order for a less-experienced operator to operate a charged particle beam device without any complicated adjustment, an operation in which a skilled person conducts manual adjustment on a charged particle beam emission condition and register the condition and a less-experienced operator calls and uses a registered value is conceivable.

An objective aperture that determines the emission current supplied to a sample in a versatile charged particle beam device, however, is typically movable, and the position of the objective aperture is assumed to be routinely changed by operators, which makes preadjustment of the position of the objective aperture difficult. It is therefore difficult to determine whether or not the position of the objective aperture resulting from manual adjustment conducted by a skilled person and the current position of the objective aperture are the same. If the position of the objective aperture is not the same as the adjusted position, the registered condition adjustment value will become irrelevant and readjustment will be required.

Furthermore, once an operator has left the charged particle beam device, the operator cannot see whether the position of the objective aperture has changed when attempting to operate the device again, which after all requires work for conducting manual adjustment and registration each time the device is used. In a versatile charged particle beam device, the Z coordinate of a sample stage can be freely set, and readjustment will also be required when the Z coordinate resulting from manual adjustment conducted by a skilled person and the current Z coordinate are different from each other.

An object of the present invention relates to enabling a versatile charged particle beam device, which is used for a wide range of kinds of samples to be observed and has parameters of emission conditions of a primary charged particle beam that is difficult to be registered in advance, to be operated easily and accurately even by a less-experienced operator and to obtain high-resolution images.

Solution to Problem

A charged particle beam device according to the present invention includes, for example, a charged particle source, a focusing lens for focusing a primary charged particle beam emitted from the charged particle source, an objective lens for focusing the primary charged particle beam onto a sample, a movable objective aperture having multiple objective apertures disposed on a side of the charged particle source with respect to the objective lens, a detector for detecting a secondary signal from the sample resulting from emission of the primary charged particle beam, a display unit configured to process and display a secondary signal detected by the detector, and a storage unit configured to store multiple emission conditions of the primary particle beam.

The operation controller makes one emission condition be selected, determines whether or not the disposed objective aperture is suitable for the selected emission condition, displays that the objective aperture is unsuitable on the image display unit when the objective aperture is unsuitable, and preadjusts the primary charged particle beam to match the selected emission condition and stores the preadjustment result as parameters for the emission conditions when the objective aperture is suitable.

A method for adjusting a charged particle beam device according to the present invention includes, for example, storing multiple emission conditions on emission of a primary charged particle beam in a storage unit; making one emission condition be selected from the emission conditions stored in the storage unit; determining whether or not a disposed objective aperture is suitable for the selected emission condition; displaying that the objective aperture is unsuitable on the image display unit when the objective aperture is unsuitable; and preadjusting the primary charged particle beam to match the selected emission condition and storing the preadjustment result as parameters for the emission conditions when the objective aperture is suitable for the selected emission condition.

Advantageous Effects of Invention

A charged particle beam device and a method for adjusting a charged particle beam device enabling a versatile charged particle beam device, which is used for a wide range of kinds of samples to be observed and has parameters of emission conditions of a primary charged particle beam that is difficult to be registered in advance, to be operated easily and accurately even by a less-experienced operator and to obtain high-resolution images can be achieved.

DESCRIPTION OF EMBODIMENTS

Figure 1:
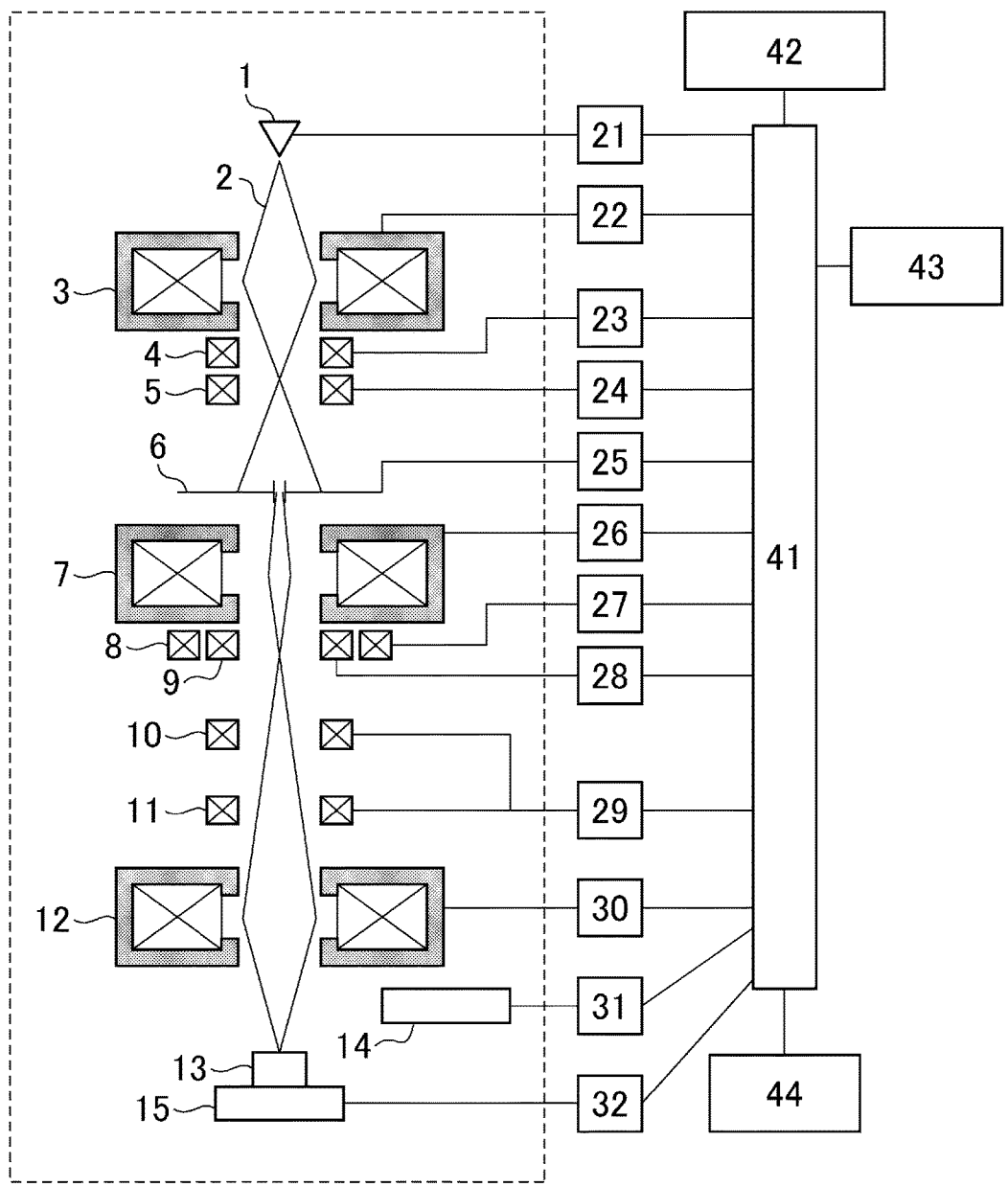
FIG. 1 is a schematic configuration diagram illustrating an example of a scanning electron microscope apparatus.

Hereinafter, embodiments of the present invention will be described with reference to the drawings.

An embodiment discloses a charged particle beam device including: a charged particle source; a focusing lens for focusing a primary charged particle beam emitted from the charged particle source; an objective lens for focusing the primary charged particle beam on a sample; a movable objective aperture having multiple objective apertures disposed on a side of the charged particle source with respect to the objective lens a detector configured to detect a secondary signal generated from the sample as a result of emission of the primary charged particle beam; an image display unit configured to perform image processing on the secondary signal detected by the detector and display the processed image; a storage unit configured to store multiple emission conditions of the primary charged particle beam; and an operation controller configured to make one of the emission conditions be selected, determine whether or not a disposed objective aperture is suitable for the selected emission condition, display that the objective aperture is unsuitable when the objective aperture is unsuitable, execute preadjustment of adjusting the primary charged particle beam to match the selected emission condition when the objective aperture is suitable for the selected emission condition, and store a result of preadjustment as parameters of emission conditions in the storage unit in advance.

Another embodiment discloses a method for adjusting a charged particle beam device according to the present invention including, for example: storing multiple emission conditions on emission of a primary charged particle beam in a storage unit; making one emission condition be selected from the emission conditions stored in the storage unit; determining whether or not a disposed objective aperture is suitable for the selected emission condition; displaying that the objective aperture is unsuitable on the image display unit when the objective aperture is unsuitable; and preadjusting the primary charged particle beam to match the selected emission condition and storing the preadjustment result as parameters for the emission conditions when the objective aperture is suitable for the selected emission condition.

An embodiment also discloses that the operation controller is configured to display the emission conditions stored in the storage unit on the image display unit to make one emission condition be selected, determine whether or not a disposed objective aperture of the multiple objective apertures is suitable for the emission condition selected with use of the image display unit, display that the objective aperture is unsuitable on the image display unit when the objective aperture is unsuitable, when the objective aperture is suitable for the selected emission condition, adjust the primary charged particle beam to match a predetermined emission condition that is a basis for adjustment, display an image for central axis alignment of the primary charged particle beam on the image display unit, and when a central axis of the primary charged particle beam is adjusted as a result of adjusting the position of the objective aperture, adjusts the primary charged particle beam to match the emission condition selected via the image display unit.

An embodiment also discloses that the preadjusted emission condition is obtained by using a dedicated sample.

An embodiment also discloses that a sample stage for supporting and moving the sample is provided and that the emission conditions include a position of the sample on the sample stage, and multiple positions on the sample stage can be set. An embodiment also discloses that the sample is supported and moved by a sample stage, and that the emission conditions include a position of the sample on the sample stage, and multiple positions on the sample stage can be set.

An embodiment also discloses that the operation controller determines whether or not the preadjustment needs to be executed again, and displays the need for preadjustment on the display unit when the preadjustment needs to be executed again.

An embodiment also discloses that, when the objective aperture is suitable for the selected emission condition, the operation controller determines whether or not the position of the objective aperture needs to be adjusted and whether or not the position of the objective aperture is adjusted to be within an allowable range.

An embodiment also discloses that a sample stage for supporting and moving the sample provided and that the operation controller determines whether or not the dedicated sample is set on the sample stage. An embodiment also discloses that the sample is supported and moved by a sample stage, and that whether or not the dedicated sample is set on the sample stage is determined.

An embodiment also discloses that the operation controller periodically conducts the preadjustment, determines whether or not maintenance of the charged particle beam device is required on a basis of an adjustment value resulting from the conducted preadjustment, and displays that maintenance is required when it is determined that the maintenance is required.

A scanning electron microscope (SEM) will be taken as an embodiment of a charged particle beam device in the embodiments described below, but the charged particle beam device is not limited thereto, and the present invention can also be applied to a focused ion beam apparatus that irradiates a sample with an ion beam emitted from a liquid metal ion source or a gas ion source, for example.

Embodiments

FIG. 1 is a schematic configuration diagram illustrating an example of a scanning electron microscope apparatus to which the present invention is applied.

In FIG. 1, the configuration inside the broken line represents a configuration inside a scanning electron microscope column 100, in which a primary electron beam 2 emitted from an electron gun 1 is converged by a first converging lens 3, a second focusing lens 7, and an objective lens 12, and the sample 13 is scanned with the primary electron beam 2 by an upper deflection coil 10 and a lower deflection coil 11. Signal electrons generated from the sample 13 are detected by a detector 14 and supplied to a computer (operation controller) 41 via a detected signal control circuit 31. A signal recorded in association with a scanning position is then displayed on an image display device 42.

The sample 13 is set on the sample stage 15 with use of a holder or the like, which is not illustrated, and is movable in a z direction (the direction of the optical axis of the primary electron beam 2 by the sample stage 15. Multiple positions of the sample stage 15 in the Z direction can be set. The primary electron beam 2 emitted to the sample 13 is limited by a movable objective aperture 6. The movable objective aperture 6 has a structure in which the objective aperture to be used can be switched between multiple objective apertures (apertures) having different sizes. The objective apertures are numbered, and it is possible to determine the number of the objective aperture being used by detecting the position of the objective aperture by the device with use of a sensor 25. Alternatively, the objective apertures may be distinguished by alphabets or names (purposes) instead of numbers.

The movable objective aperture 6 not only has the structure in which the objective aperture to be used is switched between multiple objective apertures, but also has a function of adjusting the positions of the objective apertures in the horizontal direction (in the direction of a plane perpendicular to the optical axis of the primary electron beam).

An electron beam emission condition is set in such a manner that an electron beam emission condition is selected from a list of electron beam emission conditions each being a combination of individual parameters, instead of a manner in which the parameters are individually set. Specific examples of the parameters include the accelerating voltage of the primary electron beam 2, the current of the primary electron beam 2 emitted to the sample 13, the scanning method of the primary electron beam 2 over the sample 13, and the aperture number of the movable objective aperture 6.

The Z coordinate of the sample stage 15 is also one of the parameters of the electron beam emission conditions, and specific values thereof are set for the respective electron beam emission conditions. The combination of each emission condition can also be set freely by the operator.

Note that a reference numeral 21 represents a high voltage control circuit, a reference numeral 22 represents a first focusing lens control circuit, a reference numeral 23 represents a central beam axis aligner control circuit, a reference numeral 24 represents a central beam axis alignment deflector control circuit, a reference numeral 26 represents a second focusing lens control circuit, a reference numeral 27 represents an astigmatism corrector control circuit, a reference numeral 28 represents an aligner control circuit, a reference numeral 29 represents a deflector control circuit, a reference numeral 30 represents an objective lens control circuit, a reference numeral 32 represents a sample stage drive control circuit, and a reference numeral 44 represents a manual operation panel.

Figure 2:
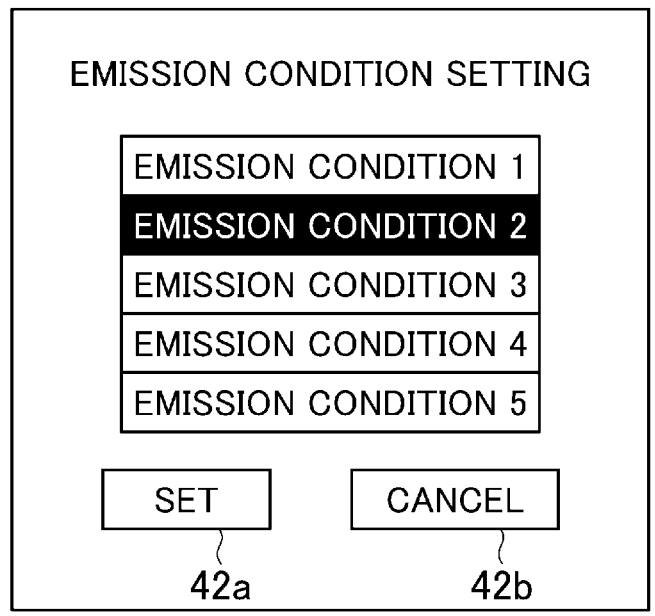
FIG. 2 illustrates an example of a user interface (UI) for selecting an emission condition.

FIG. 2 is a diagram illustrating an example of a user interface (UI) for selecting an emission condition. The screen illustrated in FIG. 2 is displayed on the image display device 42. In FIG. 2, the operator selects one of emission conditions 1 to 5 and presses a set button 42a to set the emission condition. FIG. 2 illustrates a state in which the emission condition 2 is selected.

If a cancel button 42b is pressed, a current emission condition is maintained. Necessary adjustment of the emission conditions listed and displayed on the image display device 42 is automatically made in advance, and adjustment values are registered in an storage device 43. When the emission condition illustrated in FIG. 2 is set, the set button 42a is pressed, and an adjustment value registered in advance in the storage device 43 is then called and set.

Next, six adjustments necessary when the emission condition is changed will be enumerated and explained below.

(Adjustment 1) Central Beam Axis Alignment

A central beam axis aligner 4 is used to adjust the primary electron beam 2 so that the primary electron beam 2 will pass through the center of the movable objective aperture 6. In the central beam axis alignment, the movable objective aperture 6 is scanned with the primary electron beam 2 by a central beam axis alignment deflector 5 to obtain a section image of the primary electron beam 2 on the movable objective aperture 6.

Figure 4A:
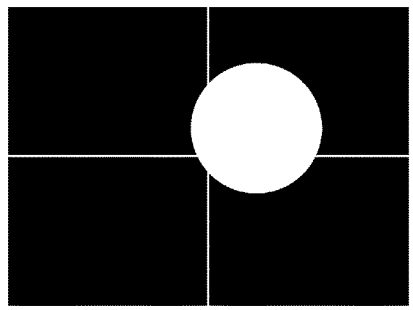
FIGS. 4A and 4B illustrate examples of an image for central beam axis alignment.
Figure 4B:
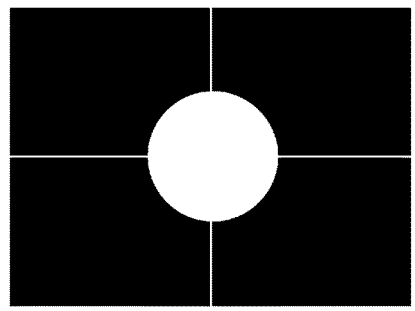

FIG. 4 illustrates examples of an image for the central beam axis alignment. FIG. 4(a) illustrates an example of the image before adjustment, and FIG. 4(b) illustrates an example of the image after adjustment. The images illustrated in FIG. 4 are generated by secondary signals generated when the primary electron beam 2 passing through the movable objective aperture 6 hits the sample 13, and displayed on the screen of the image display device 42. The center (scanning center) of the entire image for central beam axis alignment corresponds to the center of the primary electron beam 2, and the objective aperture 6 is present at the position of the white circle.

In FIG. 4(a), since the center of the white circle does not match the center of the image, it can be seen that the center of the primary electron beam 2 does not pass through the center of the movable objective aperture 6 in this state during sample image observation. When the central beam axis aligner 4 is used to move the center of the white circle to the center of the image as illustrated in FIG. 4(b), the state in which the primary electron beam 2 passes through the center of the objective aperture 6 can be achieved.

(Adjustment 2) Adjustment of Optical Axis Misalignment of Objective Lens

Excitation current of the objective lens 12 is periodically changed, and the primary electron beam 2 is adjusted with use of an aligner 9 in such a manner that the amount of shift of the image in this process is minimized.

(Adjustment 3) Astigmatism Correction

Astigmatism is corrected with use of an astigmatism corrector 8.

(Adjustment 4) Image Movement Compensation During Astigmatism Correction

If the primary electron beam 2 is deviated from the center of the astigmatism corrector 8, the field of view will move while astigmatism is being corrected with use of the astigmatism corrector 8, which makes the adjustment difficult. Thus, adjustment is made so that the field of view that has moved in conjunction with the operation of the astigmatism corrector 8 can be canceled by the aligner 9.

(Adjustment 5) Focus Adjustment

Adjustment is made by changing the excitation current of the objective lens 12 so that the primary electron beam 2 will be focused on the sample 13.

(Adjustment 6) Brightness Contrast Adjustment

The brightness contrast of the image displayed on the image display device 42 is adjusted.

The aforementioned six adjustments are those necessary when the emission condition is changed.

The values registered in the aforementioned preadjustment relate to Adjustments 1 to 4 of the six adjustments. Since Adjustment 5 and Adjustment 6 can be easily conducted even by a beginner, values therefor are not registered; such values, however, may be registered.

Figure 3:
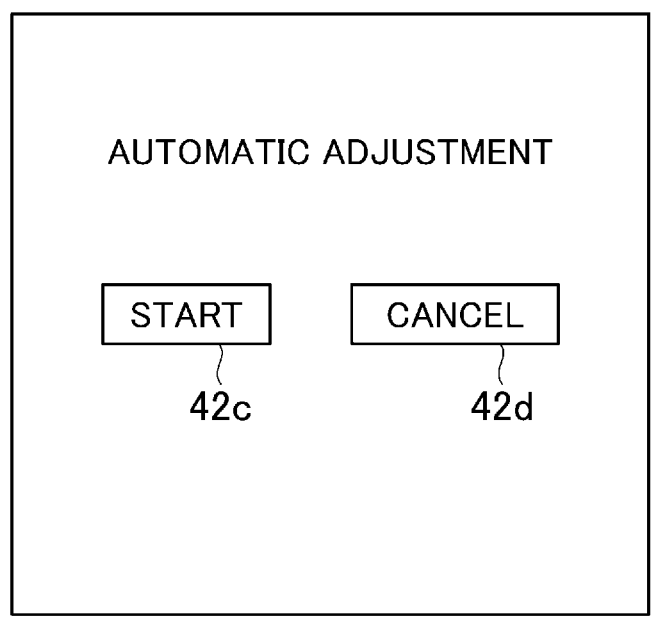
FIG. 3 illustrates an example of an UI for starting automatic preadjustment.

FIG. 3 is a diagram illustrating an example of an UI for starting automatic preadjustment. The screen illustrated in FIG. 3 is displayed on the image display device 42. When a start button 42c illustrated in FIG. 3 is pressed, preadjustment is automatically conducted on all the emission conditions 1 to 5 illustrated in FIG. 2.

Figure 5:
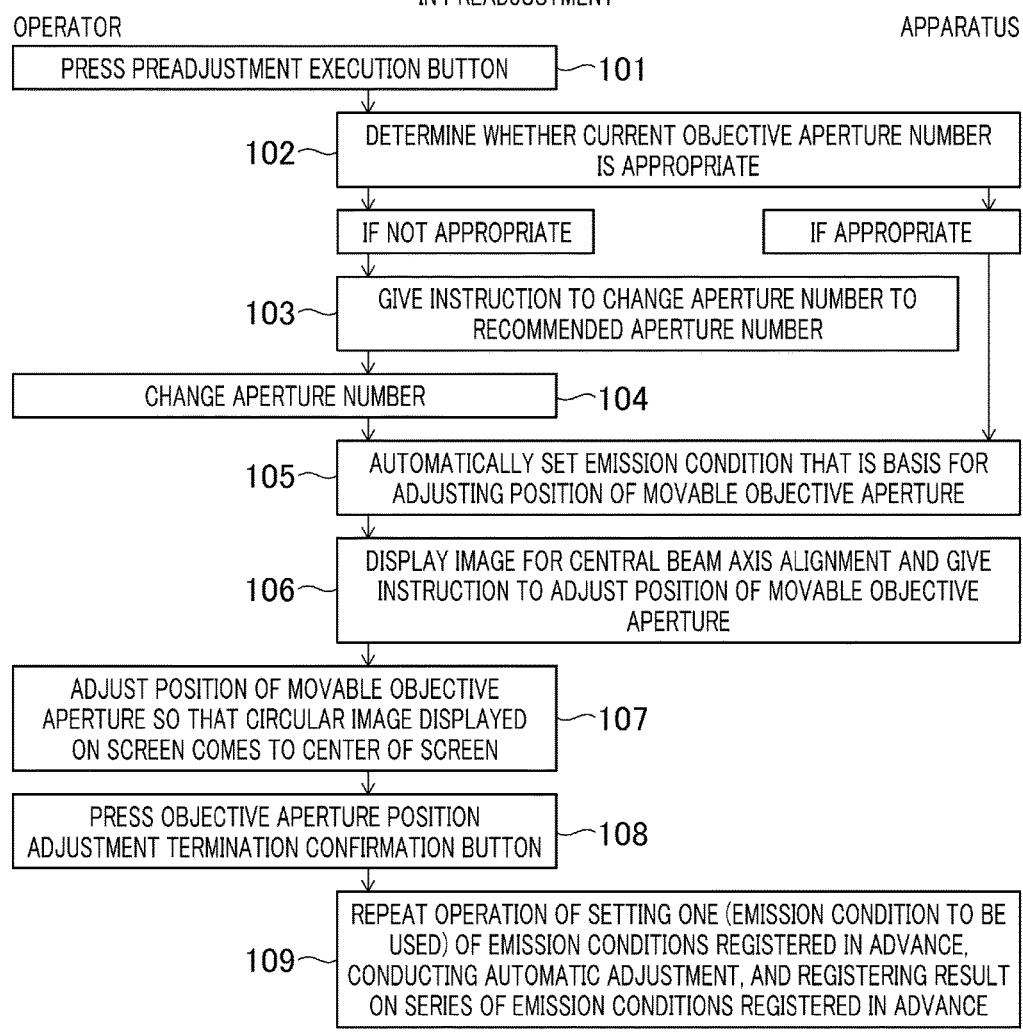
FIG. 5 illustrates an example of an operation flowchart of preadjustment.

FIG. 5 illustrates an example of an operation flowchart of the preadjustment. In the flowchart illustrated in FIG. 5, the work of an operator and the operation of a scanning electron microscope apparatus (instructing operation of a computer 41) are presented on the left and on the right, respectively, separately from each other so as to be distinguished from each other.

When the operator presses an automatic adjustment execution button (the start button 42c in FIG. 3) in step 101 of FIG. 5, it is determined in step 102 whether or not the aperture number of the currently used movable objective aperture 6 is appropriate for the emission condition to be adjusted.

Figure 6:
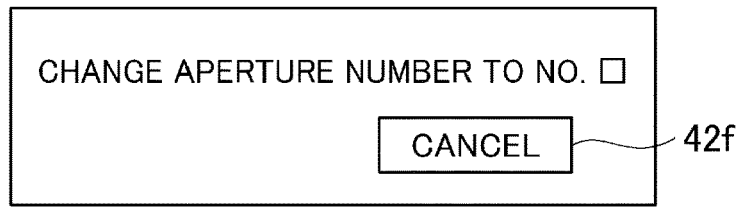
FIG. 6 illustrates an example of an instruction image for changing an aperture number to a recommended aperture number.

If it is determined in step 102 that an inappropriate aperture number is selected, an instruction to change the aperture number to a recommended aperture number is displayed on the image display device 42 as illustrated in FIG. 6 (step 103). The operator changes the number of the objective apertures 6 by using the image display device 42 in accordance with the instruction displayed as an image (step 104).

Figure 7:
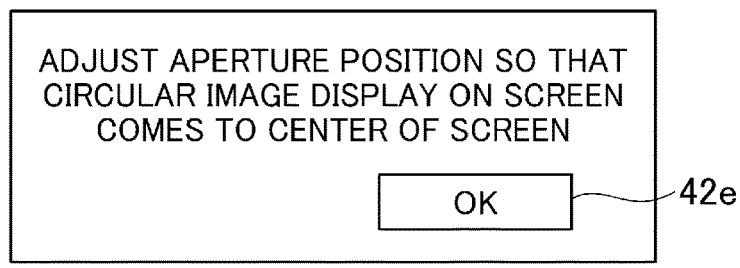
FIG. 7 illustrates an example of an instruction image for adjusting the position of a movable objective aperture.

When the number of the objective aperture is changed, the scanning electron microscope apparatus sets the apparatus under an emission condition that is a basis for adjusting the position of the movable objective aperture 6 (step 105). The scanning electron microscope apparatus then displays an image for central beam axis alignment on the image display device 42, and thereafter displays an instruction to adjust the position of the movable objective aperture 6 as illustrated in FIG. 7 (step 106).

Note that multiple emission conditions that are bases for adjustment may be present. Furthermore, an emission condition other than those listed in FIG. 2 may be used.

Subsequently, the operator adjusts the position of the movable objective aperture 6 so that a circular image (the same as that in FIG. 4) displayed on the screen comes to the center of the screen (step 107). Whether adjustment of the position of the movable objective aperture 6 is required or not can alternatively be automatically determined by the scanning electron microscope apparatus on the basis of the position of the white circle in FIG. 4. While the primary electron beam 2 is adjusted to the center of the movable objective aperture 6 in Adjustment 1 described above, the center of the movable objective aperture 6 is adjusted to the center of the primary electron beam 2 in aperture position adjustment in step 107.

When the operator has pressed an objective aperture position adjustment termination confirmation button (an OK button 42e in FIG. 7) (step 108), the scanning electron microscope apparatus repeats an operation of setting the emission condition to one (the emission condition to be used) of the emission conditions registered in advance, executing automatic adjustment, and registering the result (an adjustment value that meets the emission condition) on a series of emission conditions registered in advance (step 109).

As a result of providing a basis for aperture position adjustment, it is possible to readjust the objective aperture 6 to the same position even when the position of the objective aperture 6 is shifter after the adjustment for some reason after the adjustment. The scanning electron microscope apparatus can also automatically determine whether or not the movable objective aperture 6 is successfully adjusted; and when the objective aperture 6 is not successfully adjusted, the scanning electron microscope apparatus can present a message for adjustment again.

Figure 8:
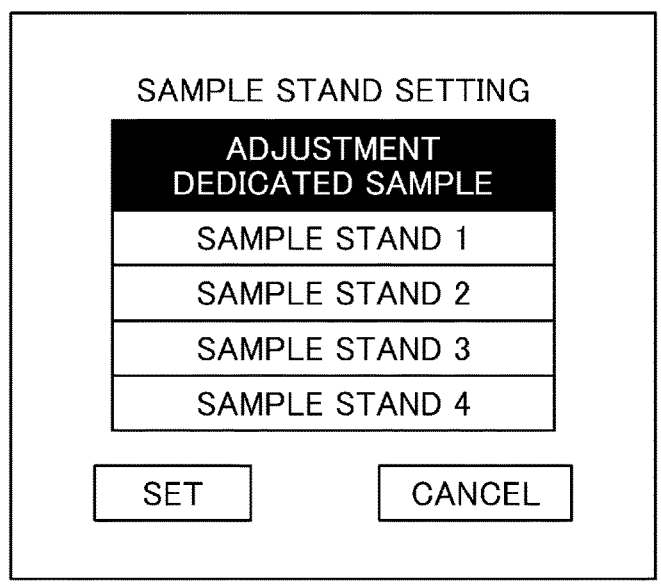
FIG. 8 illustrates an example of a sample stand setting screen.

Note that a dedicated sample is used for automatic preadjustment. This is to prevent failure of the automatic adjustment. A sample having a random structure when observed at a target observation magnification is provided as the dedicated sample. After the dedicated sample is set on the sample stage 15, an "adjustment dedicated sample" is selected from a sample stand setting screen (the screen of the image display device 42) illustrated in FIG. 8.

As a result, the scanning electron microscope apparatus can determine that the adjustment dedicated sample is set, and thus displays the automatic adjustment start screen illustrated in FIG. 3. If the sample dedicated for preadjustment is marked so that the apparatus can determine that the set sample is a dedicated sample, it is possible to prevent the operator from setting another sample by mistake and thus prevent preadjustment from becoming unsuccessful.

While the objective aperture 6 is manually adjusted in the example described above, preadjustment can also be conducted in a case where the operation of the objective aperture can be electrically controlled.

Figure 9:
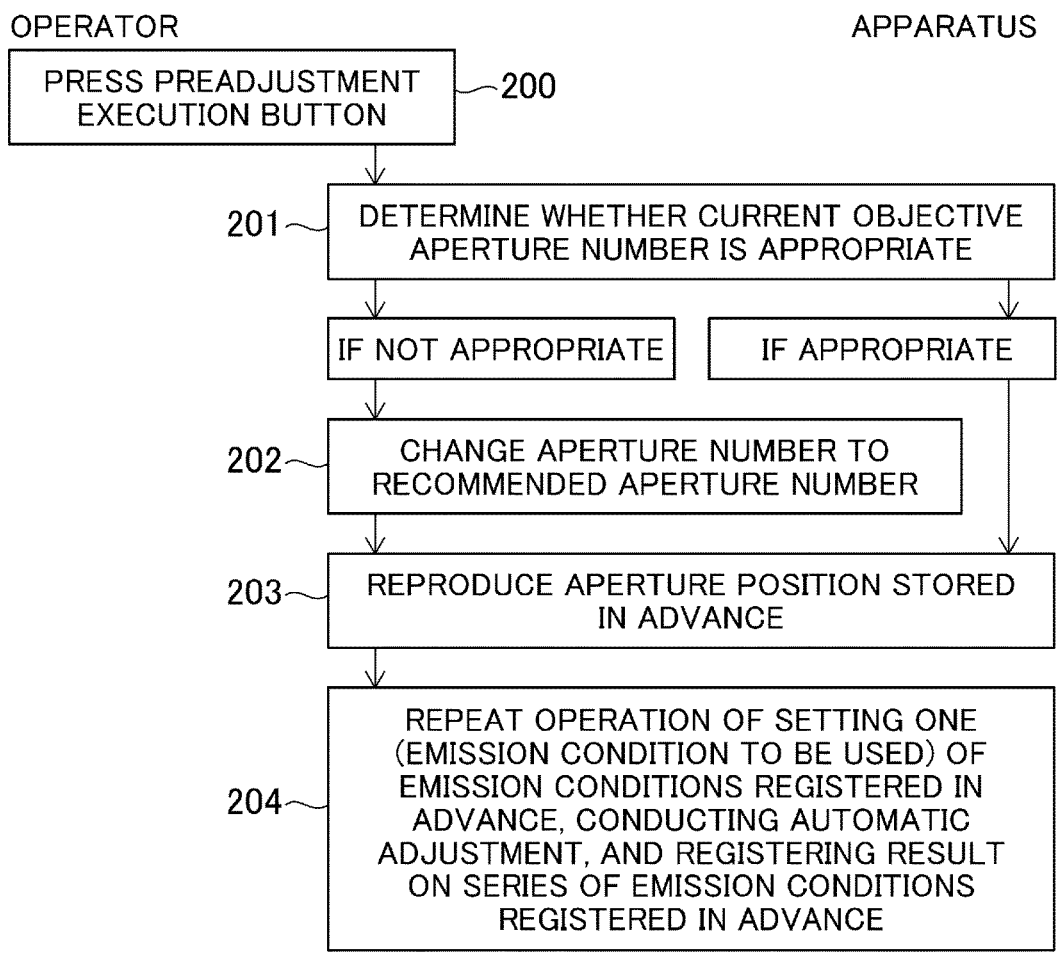
FIG. 9 illustrates an example of a preadjustment operation flowchart in a case where a movable objective aperture 6 can be electrically controlled.

FIG. 9 is a diagram illustrating an example of a preadjustment operation flowchart in a case where the movable objective aperture 6 can be electrically controlled. In the flowchart illustrated in FIG. 9, similarly to the flowchart of FIG. 5, the work of the operator and the operation of the scanning electron microscope apparatus are presented on the left and on the right, respectively, separately from each other.

In FIG. 9, when the operator presses the automatic adjustment execution button (the start button 42c in FIG. 3) (step 200), the apparatus determines whether the aperture number of the currently used movable objective aperture 6 is appropriate (step 201). If an inappropriate aperture number is selected in step 201, the aperture number is automatically changed to a recommended aperture number (step 202).

After changing the aperture number in step 202, the scanning electron microscope apparatus reproduces the aperture position stored in advance in the storage device 43 (step 203). The scanning electron microscope apparatus repeats an operation of setting the emission condition to one (the emission condition to be used) of the emission conditions registered in advance in the storage device 43, executing automatic adjustment, and registering the result on the series of emission conditions registered in advance (step 204).

In a case where the operation of the objective aperture 6 can be electrically controlled, a dedicated sample can also be used for automatic preadjustment and the automatic adjustment can also be prevented from becoming unsuccessful as described above.

Figure 10:
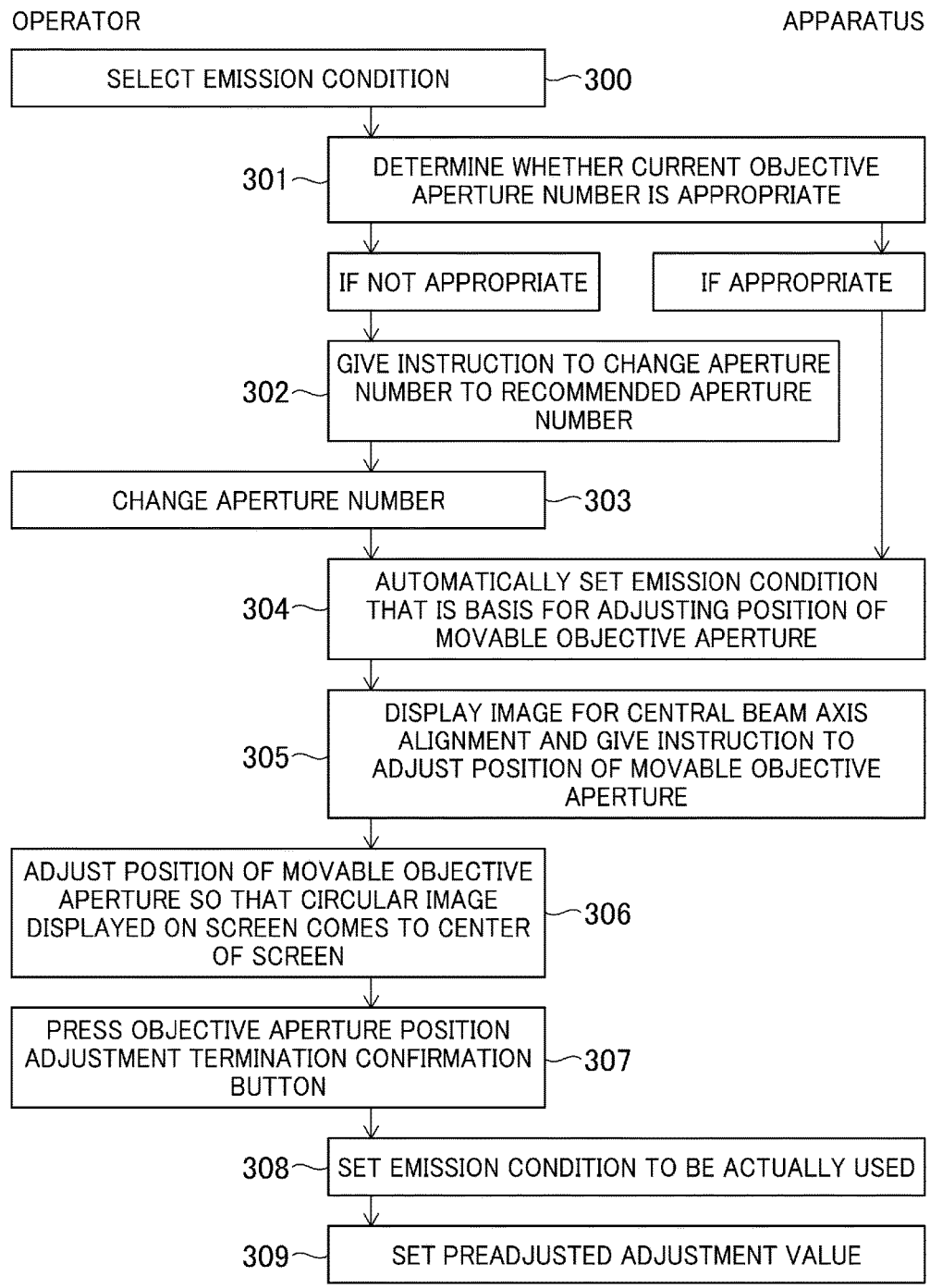
FIG. 10 illustrates an example of an operation flowchart during normal use of the scanning electron microscope apparatus.

FIG. 10 is a diagram illustrating an operation flowchart during normal use of the scanning electron microscope apparatus. In the flowchart illustrated in FIG. 10, similarly to the flowcharts of FIGS. 5 and 9, the work of the operator and the operation of the scanning electron microscope apparatus are presented on the left and on the right, respectively, separately from each other.

In FIG. 10, when the operator selects an emission condition by using the UI screen illustrated in FIG. 2 (step 300), the scanning electron microscope apparatus determines whether or not the number of the current objective aperture 6 is appropriate for the selected emission condition (step 301). If the number of the objective aperture is not appropriate, the scanning electron microscope apparatus gives an instruction to change the number of the objective aperture to that of a recommended objective aperture as the screen display illustrated in FIG. 6 (step 302). The operator changes the number of the objective aperture in accordance with the instruction (step 303).

When the number of the objective aperture is changed, the scanning electron microscope apparatus automatically sets an emission condition that is a basis for adjusting the position of the movable objective aperture 6 (step 304), displays an image for central beam axis alignment (the same as the image illustrated in FIG. 4), and thereafter gives an instruction to adjust the position of the movable objective aperture 6 (step 305). Whether adjustment of the position of the movable objective aperture 6 is required or not can alternatively be automatically determined by the apparatus.

The operator adjusts the position of the movable objective aperture 6 so that the circular image displayed on the screen comes to the center of the screen (step 306). As a result of providing the basis for the aperture position adjustment, the objective aperture 6 can be adjusted to the same position as the adjusted position. When the operator presses an objective aperture position adjustment termination confirmation button (the OK button 42e in FIG. 7) (step 307), the emission condition to be actually used selected by the operator is set (step 308). A preadjusted and registered adjustment value is called and set (309).

The apparatus can also automatically determine whether or not the movable objective aperture 6 is successfully adjusted; and when the objective aperture 6 is not successfully adjusted, the apparatus can present a message instructing readjustment.

Figure 11:
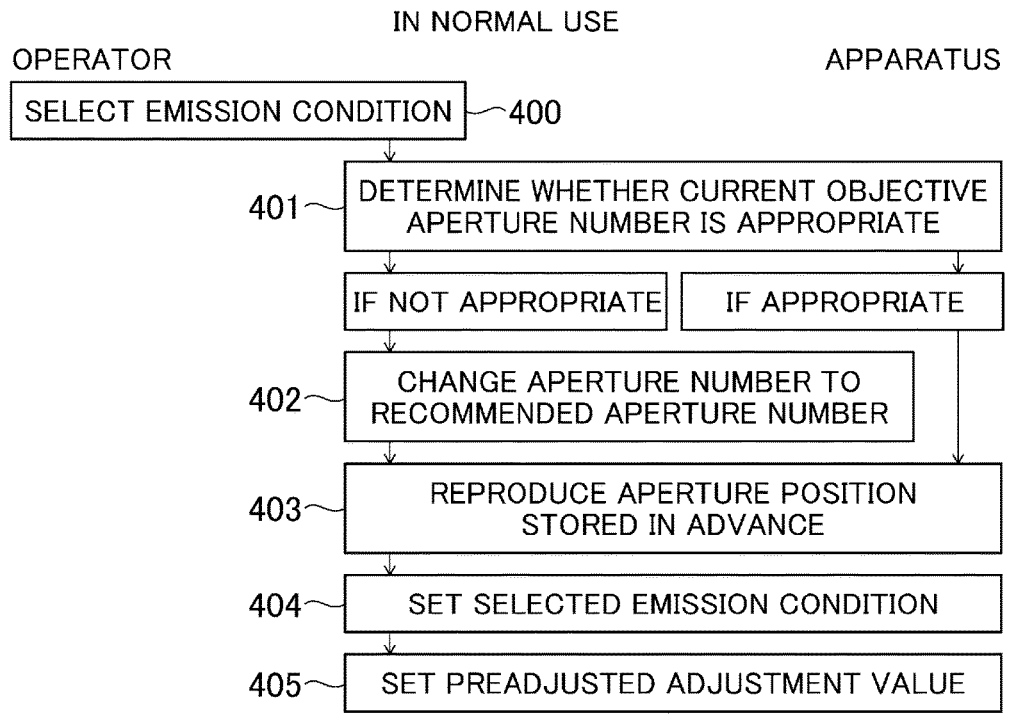
FIG. 11 illustrates an example of an operation flowchart during normal use in a case where the movable objective aperture can be electrically controlled.

FIG. 11 is a diagram illustrating an example of an operation flowchart during normal use in a case where the movable objective aperture 6 can be electrically controlled. In the flowchart illustrated in FIG. 11, similarly to the flowcharts of FIGS. 5, 9 and 10, the work of the operator and the operation of the scanning electron microscope apparatus are presented on the left and on the right, respectively, separately from each other.

In FIG. 11, when the operator selects an emission condition by using the UI screen illustrated in FIG. 2 (step 400), the scanning electron microscope apparatus determines whether or not the number of the current objective aperture 6 is appropriate (step 401). If the number of the objective aperture 6 is not appropriate, the scanning electron microscope apparatus gives an instruction to change the number of the objective aperture 6 to that of a recommended objective aperture 6 with the screen illustrated in FIG. 7. The operator changes the number of the aperture in accordance with the instruction (step 402).

After changing the aperture number, the scanning electron microscope apparatus reproduces the position of the objective aperture 6 stored in advance in the storage device 43 (step 403). The scanning electron microscope apparatus then sets the emission condition initially selected by the operator (step 404). A preadjusted and registered adjustment value is called and set (step 405).

Figure 12:
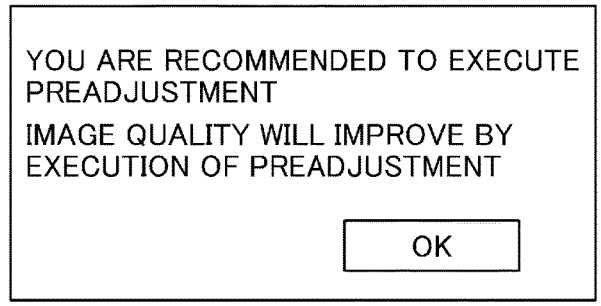
FIG. 12 illustrates an example of a scree indicating that execution of preadjustment is recommended.

The preadjustment described above is desirably conducted periodically. It is automatically determined whether or not preadjustment needs to be conducted again on the basis of history of switching of the movable objective aperture number or time elapsed from the previous adjustment, and the operator is given a warning thereof. FIG. 12 illustrates an example of a screen indicating that execution of preadjustment is recommended (a screen displaying the need to execute preadjustment). The screen illustrated in FIG. 12 is displayed on a screen of the image display device 42. Adjustment values resulting from periodical adjustment and being recording are then recorded as logs in the storage device 43.

Figure 13:
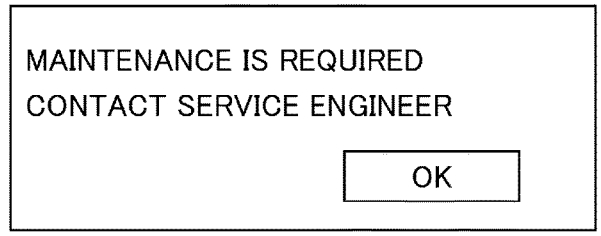
FIG. 13 illustrates an example of a screen indicating that maintenance is required.

Furthermore, if a value different by a predetermined amount or larger from an adjustment value obtained by a service engineer is recorded, it is determined that maintenance is required, and a message indicating to contact the service engineer is displayed. FIG. 13 illustrates an example of a screen indicating that maintenance is required. The screen illustrated in FIG. 13 is displayed on a screen of the image display device 42.

As described above, according to the embodiments, in preadjustment of each emission condition, it is determined whether or not an objective aperture is appropriate and the result of determination is displayed, the scanning electron microscope apparatus is adjusted to match the emission condition when an appropriate objective aperture is used, the operator is instructed to adjust the objective aperture, an image for adjustment of the objective aperture is displayed, the position of the objective aperture is adjusted, and then the adjustment result is registered.

In normal use, when a registered emission condition is selected, it is determined whether or not an objective aperture is appropriate, and a recommended objective aperture is displayed when the objective aperture is inappropriate. The scanning electron microscope apparatus is then automatically adjusted with use of an appropriate objective aperture so that the emission condition will be an emission condition that is a basis for the adjustment, thereafter the operator is instructed to adjust the objective aperture, an image for adjustment of the objective aperture is displayed, the position of the objective aperture is adjusted, and the scanning electron microscope apparatus is then automatically adjusted so that the previously selected emission condition is set.

It is therefore possible even for a less-experienced operator to easily and accurately operate a versatile charged particle beam device, which is used for a wide range of kinds of samples to be observed and has parameters that are difficult to be registered in advance such as adjusted positions of the objective aperture, to obtain high-resolution images.

While adjustment relating to adjustment of the movable objective aperture is applied in the examples described above, the Z coordinate of the sample stage can also be appropriately adjusted by displaying a request for adjustment to the operator and displaying an image for adjustment similarly to the movable objective aperture.

REFERENCE SIGNS LIST 1 electron gun
2 primary electron beam
3 first converging lens
4 central beam axis aligner
5 central beam axis alignment deflector
6 movable objective aperture
7 second focusing lens
8 astigmatism corrector
9 aligner
10 upper deflector
11 lower deflector
12 objective lens
13 sample
14 detector
15 sample stage
21 high voltage control circuit
22 first focusing lens control circuit
23 central beam axis aligner control circuit
24 central beam axis alignment deflector control circuit
25 sensor for determining used movable objective aperture number
26 second focusing lens control circuit
27 astigmatism corrector control circuit
28 aligner control circuit
29 deflector control circuit
30 objective lens control circuit
31 detected signal control circuit
32 sample stage drive control circuit
41 computer
42 image display device
43 storage device
44 manual operation panel
100 scanning electron microscope column

The invention claimed is:

1. A charged particle beam device comprising:
a charged particle source;
a focusing lens for focusing a primary charged particle beam emitted from the charged particle source;
an objective lens for focusing the primary charged particle beam on a sample;
a movable objective aperture having a plurality of objective apertures disposed on a side of the charged particle source with respect to the objective lens;
a detector configured to detect a secondary signal generated from the sample as a result of emission of the primary charged particle beam;
an image display unit configured to perform image processing on the secondary signal detected by the detector and display the processed image;
a storage unit configured to store a plurality of emission-condition sets of the primary charged particle beam;
a user interface configured to receive selection of one of the emission-condition sets among the plurality of emission-condition sets; and
an operation controller configured to determine whether or not a disposed objective aperture is suitable for the selected emission-condition set, display that the disposed objective aperture is unsuitable when the disposed objective aperture is unsuitable, execute preadjustment of position of the disposed objective aperture when the disposed objective aperture is suitable for the selected emission-condition set, and store a result of the preadjustment as parameters for observation;
wherein when the objective aperture is suitable for the selected emission condition, the operation controller determines whether or not the position of the objective aperture needs to be adjusted and whether or not the position of the objective aperture is adjusted to be within an allowable range.

2. The charged particle beam device according to claim 1, wherein the preadjustment is obtained by using a dedicated sample.

3. The charged particle beam device according to claim 1, further comprising a sample stage for supporting and moving the sample, wherein
the emission conditions include a position of the sample on the sample stage, and multiple positions on the sample stage can be set.

4. The charged particle beam device according to claim 1, wherein the operation controller determines whether or not the preadjustment needs to be executed again, and displays the need for preadjustment on the user interface when the preadjustment needs to be executed again.

5. The charged particle beam device according to claim 2, further comprising a sample stage for supporting and moving the sample, wherein
the operation controller determines whether or not the dedicated sample is set on the sample stage.

6. The charged particle beam device according to claim 1, wherein the operation controller periodically conducts the preadjustment, determines whether or not maintenance of the charged particle beam device is required on a basis of an adjustment value resulting from the conducted preadjustment, and displays that maintenance is required when it is determined that the maintenance is required.

7. A method for adjusting a charged particle beam device, the method comprising:
   storing a plurality of emission-condition sets on emission of a primary charged particle beam in a storage unit;
   selecting one of the emission-condition sets stored in the storage unit;
   determining whether or not a disposed objective aperture is suitable for the selected emission-condition set;
   displaying that the disposed objective aperture is unsuitable on a user interface when disposed the objective aperture is unsuitable;
   preadjusting position of the disposed objective aperture and storing the preadjustment result as parameters for observation when the disposed objective aperture is suitable for the selected emission-condition set; and
   when the objective aperture is suitable for the selected emission-condition set, determining whether or not the position of the objective aperture needs to be adjusted and whether or not the position of the objective aperture is adjusted to be within an allowable range.

8. The method for adjusting a charged particle beam device according to claim 7, wherein the preadjustment is obtained by using a dedicated sample.

9. The method for adjusting a charged particle beam device according to claim 7, wherein the sample is supported and moved by a sample stage, each of the emission-condition sets also includes a position of the sample on the sample stage, and multiple positions on the sample stage can be set.

10. The method for adjusting a charged particle beam device according to claim 7, further comprising:
    determining whether or not the preadjustment needs to be executed again; and
    displaying the need for preadjustment on the user interface when the preadjustment needs to be executed again.

11. The method for adjusting a charged particle beam device according to claim 8, wherein the sample is supported and moved by a sample stage for supporting and moving the sample, and the method further comprising: determining whether or not the dedicated sample is set on the sample stage.

12. The method for adjusting a charged particle beam device according to claim 7, further comprising:
    periodically conducting the preadjustment;
    determining whether or not maintenance of the charged particle beam device is required on a basis of an adjustment value resulting from the conducted preadjustment; and
    displaying that maintenance is required when it is determined that the maintenance is required.

13. A charged particle beam device comprising:
    a charged particle source;
    a focusing lens for focusing a primary charged particle beam emitted from the charged particle source;
    an objective lens for focusing the primary charged particle beam on a sample;
    a movable objective aperture having a plurality of objective apertures disposed on a side of the charged particle source with respect to the objective lens;
    a detector configured to detect a secondary signal generated from the sample as a result of emission of the primary charged particle beam;
    a storage unit configured to store an emission condition for preadjusting position of the movable objective aperture; and
    an operation controller configured to execute preadjustment of the position of the movable objective aperture based on the emission-condition and store a result of the preadjustment as parameters for observation;
    wherein when the objective aperture is suitable for the selected emission condition, the operation controller determines whether or not the position of the objective aperture needs to be adjusted and whether or not the position of the objective aperture is adjusted to be within an allowable range.

* * * * *